United States Patent
Oyama et al.

(10) Patent No.: US 11,432,444 B2
(45) Date of Patent: Aug. 30, 2022

(54) COMPONENT MOUNTING MACHINE

(71) Applicant: FUJI CORPORATION, Chiryu (JP)

(72) Inventors: Shigeto Oyama, Kariya (JP); Jun Iisaka, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 122 days.

(21) Appl. No.: 16/646,441

(22) PCT Filed: Sep. 28, 2017

(86) PCT No.: PCT/JP2017/035256
§ 371 (c)(1),
(2) Date: Mar. 11, 2020

(87) PCT Pub. No.: WO2019/064440
PCT Pub. Date: Apr. 4, 2019

(65) Prior Publication Data
US 2020/0296869 A1 Sep. 17, 2020

(51) Int. Cl.
*H05K 13/04* (2006.01)
*H05K 13/02* (2006.01)

(52) U.S. Cl.
CPC ......... *H05K 13/0409* (2018.08); *H05K 13/02* (2013.01); *H05K 13/041* (2018.08); *H05K 2203/082* (2013.01)

(58) Field of Classification Search
CPC .. H05K 13/02; H05K 13/0409; H05K 13/041; H05K 13/0813; H05K 2203/082
See application file for complete search history.

(56) References Cited

U.S. PATENT DOCUMENTS

| | | | |
|---|---|---|---|
| 6,550,134 B2* | 4/2003 | Asai | H05K 13/041 29/833 |
| 6,662,437 B2* | 12/2003 | Kawashima | H05K 13/0417 29/740 |

(Continued)

FOREIGN PATENT DOCUMENTS

| | | |
|---|---|---|
| EP | 2 848 377 A1 | 3/2015 |
| JP | 2003-23294 A | 1/2003 |

(Continued)

OTHER PUBLICATIONS

International Search Report dated Nov. 21, 2017 in PCT/JP2017/035256 filed on Sep. 28, 2017, 2 pages

*Primary Examiner* — Minh N Trinh
(74) *Attorney, Agent, or Firm* — Oblon, McClelland, Maier & Neustadt, L.L.P.

(57) ABSTRACT

A component mounting machine includes a head including multiple nozzles; a negative pressure supply device supplying negative pressure from a negative pressure source individually to suction openings of the multiple nozzles; a raising and lowering device to individually raise and lower the multiple nozzles; and a control device performing a first pickup operation of controlling the raising and lowering device to lower one of the nozzles and controlling the negative pressure supply device to supply negative pressure to pick up the component using the suction opening of that nozzle, and a second pickup operation of controlling the raising and lowering device to lower multiple of the nozzles simultaneously and controlling the negative pressure supply device to supply negative pressure to the suction openings of those multiple nozzles to pick up the components simultaneously using the suction openings of those multiple nozzles.

6 Claims, 6 Drawing Sheets

(56) References Cited

U.S. PATENT DOCUMENTS

| | | | |
|---|---|---|---|
| 8,091,216 B2* | 1/2012 | Saho | H05K 13/0411 |
| | | | 29/743 |
| 11,039,557 B2* | 6/2021 | Endo | H05K 13/0015 |
| 2001/0001167 A1* | 5/2001 | Asai | H05K 13/0812 |
| | | | 29/833 |
| 2004/0234419 A1 | 11/2004 | Burger et al. | |
| 2009/0044401 A1 | 2/2009 | Maenishi | |
| 2015/0237740 A1* | 8/2015 | Nozawa | H05K 13/0417 |
| | | | 29/739 |
| 2015/0282398 A1* | 10/2015 | Kawaguchi | H05K 13/0406 |
| | | | 29/740 |
| 2017/0202117 A1* | 7/2017 | Kito | H05K 13/0465 |
| 2018/0279520 A1 | 9/2018 | Tsuri | |
| 2020/0245515 A1* | 7/2020 | Mizutani | H05K 13/041 |
| 2020/0296869 A1* | 9/2020 | Oyama | H05K 13/0409 |

FOREIGN PATENT DOCUMENTS

| | | |
|---|---|---|
| JP | 2004-527924 A | 9/2004 |
| JP | 2007-281432 A | 10/2007 |
| JP | 2008-172021 A | 7/2008 |
| JP | 2008-227402 A | 9/2008 |
| JP | 2011-44501 A | 3/2011 |
| WO | WO 2017/056292 A1 | 4/2017 |

* cited by examiner

COMPONENT MOUNTING MACHINE

TECHNICAL FIELD

This specification discloses a component mounting machine.

BACKGROUND ART

Conventionally, there is a component mounter in which a head having multiple nozzles that can be raised and lowered individually is mounted. For example, patent literature 1 discloses a component mounting device equipped with a rotary type mounting head including multiple nozzle shafts each provided with a suction nozzle, a rotation body that holds the multiple nozzle shafts movably in a vertical direction, and a switching device that switches the pressure supplied to each suction nozzle to and from negative pressure and positive pressure. The mounting head has two Z-axis driving devices for raising and lowering, from the multiple nozzle shafts, a nozzle shaft that is at a particular position.

CITATION LIST

Patent Literature

Patent literature 1: WO2017/056292A1

BRIEF SUMMARY

Technical Problem

In a mounting head having multiple Z-axis driving devices, by simultaneously lowering multiple suction nozzles by multiple Z-axis driving devices, it is possible to perform simultaneous pickup operation for simultaneously picking up multiple components from multiple component feeders arranged in a component supply section of a component mounting machine. However, in a head where negative pressure can be supplied to multiple nozzles from one negative pressure source, when simultaneous pickup operation is performed, if pickup errors occur simultaneously at multiple nozzles, the quantity of negative pressure leaking from the nozzles becomes excessive, and there is a possibility that components which have been picked up by another suction nozzle may fall due to insufficient negative pressure.

An object of the present disclosure to provide a component mounting machine capable of picking up as many components as possible using multiple nozzles while suppressing dropping of a component held by another suction nozzle even when a pickup error occurs.

Solution to Problem

The present disclosure employs the following means to achieve the above object.

Disclosed here is a component mounting machine including: multiple component feeders arranged in a line on a component supply section of the component mounting machine, the component mounting being configured to pick up a component supplied from the component feeder and mount the component on a board; a head including multiple nozzles configured to pick up the component using a suction opening; a negative pressure supply device including a negative pressure source configured to generate negative pressure, the negative pressure supply device being configured to supply negative pressure from the negative pressure source individually to the suction openings of the multiple nozzles; a raising and lowering device configured to individually raise and lower the multiple nozzles; and a control device configured to, as a pickup operation of picking up the component using the suction opening of the nozzle, perform a first pickup operation of controlling the raising and lowering device to lower one of the nozzles and controlling the negative pressure supply device to supply negative pressure to the suction opening of that nozzle so as to pick up the component using the suction opening of that nozzle, and a second pickup operation of controlling the raising and lowering device to lower multiple of the nozzles simultaneously and controlling the negative pressure supply device to supply negative pressure to the suction openings of those multiple nozzles so as to pick up the components simultaneously using the suction openings of those multiple nozzles, wherein the control device is configured to perform the second pickup operation in a case in which an absolute value of the negative pressure from the negative pressure source is equal to or greater than a first threshold value, perform the first pickup operation in a case in which the absolute value of the negative pressure from the negative pressure source is less than the first threshold value and equal to or greater than a second threshold value that is lower than the first threshold value, and not perform any pickup operation in a case in which the absolute value of the negative pressure from the negative pressure source is less than the second threshold value.

A component mounting machine of the disclosure includes a control device configured to perform, as a pickup operation of picking up a component using a nozzle, a first pickup operation and a second pickup operation. In the first pickup operation, the raising and lowering device is controlled such that one nozzle is lowered, and the negative pressure supply device is controlled such that negative pressure is supplied to the suction opening of the one nozzle to pick up the component using the nozzle. In the second pickup operation, the raising and lowering device is controlled such that the multiple nozzles are lowered simultaneously, and the negative pressure supply device is controlled such that negative pressure is supplied to the suction openings of multiple nozzles such that multiple components are picked up simultaneously by the multiple nozzles. The control device performs the second pickup operation in a case in which an absolute value of the negative pressure from the negative pressure source is equal to or greater than a first threshold value, performs the first pickup operation in a case in which the absolute value of the negative pressure from the negative pressure source is less than the first threshold value and equal to or greater than a second threshold value that is lower than the first threshold value, and does not perform any pickup operation in a case in which the absolute value of the negative pressure from the negative pressure source is less than the second threshold value. As a result, the disclosed component mounting machine can pick up as many components as possible using multiple nozzles while suppressing the dropping of components held by other suction nozzles even when a pickup error occurs.

DESCRIPTION OF EMBODIMENTS

Embodiments of the present disclosure are described below with reference to the figures.

Figure 1:
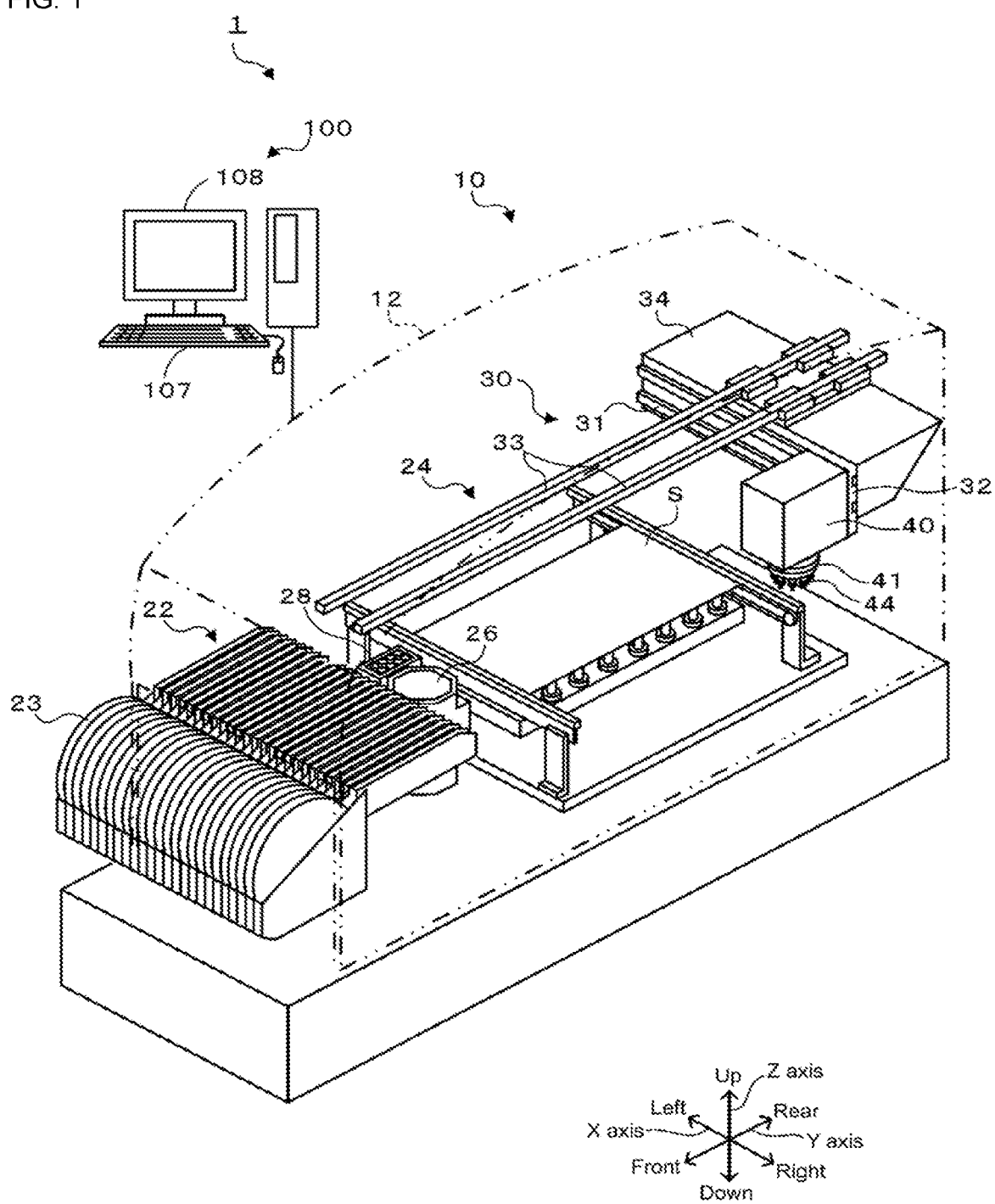
FIG. 1 is a configuration diagram showing an outline of the configuration of component mounting system 1.
Figure 2:
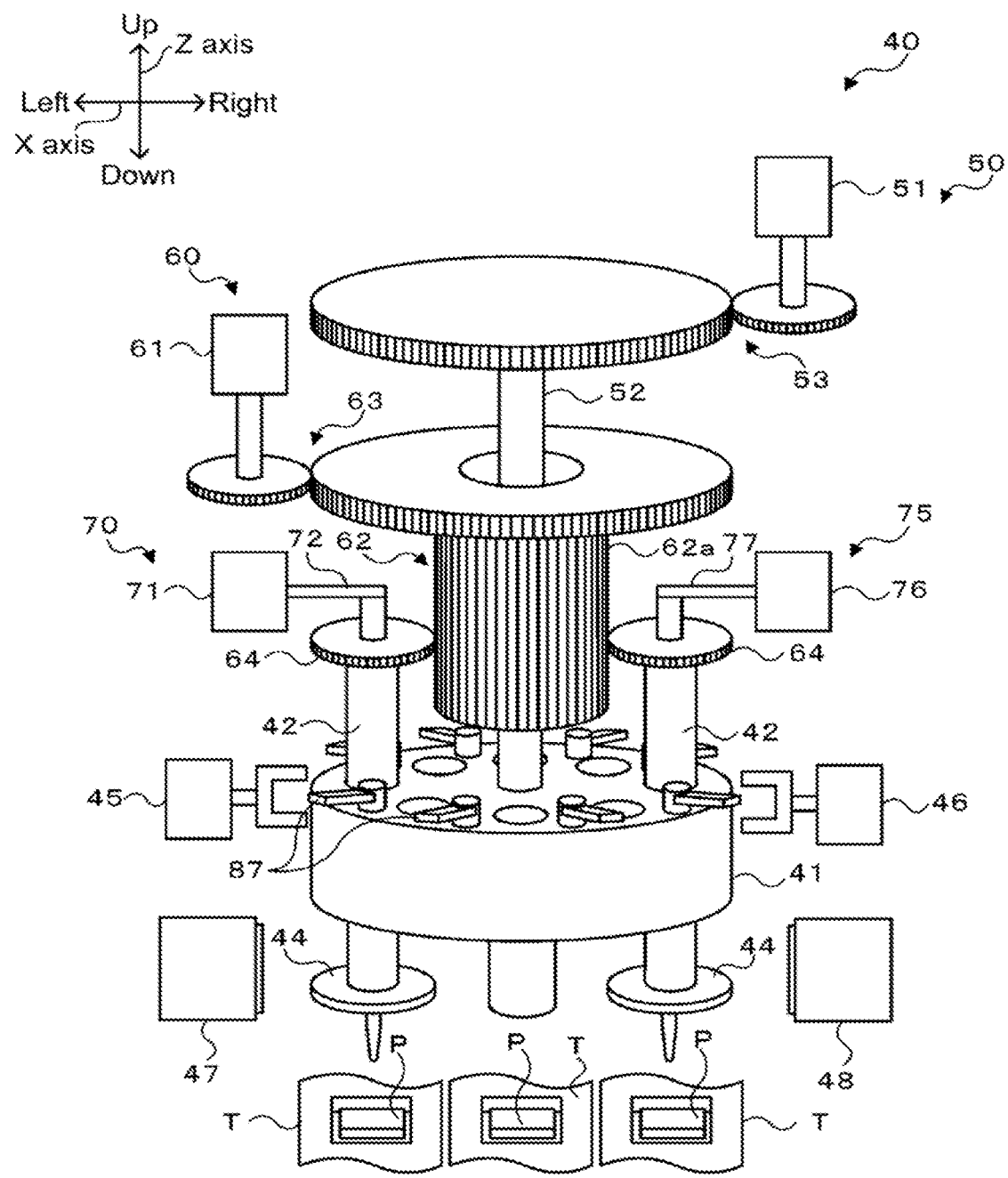
FIG. 2 is a configuration diagram showing an outline of the configuration of mounting head 40.
Figure 3:
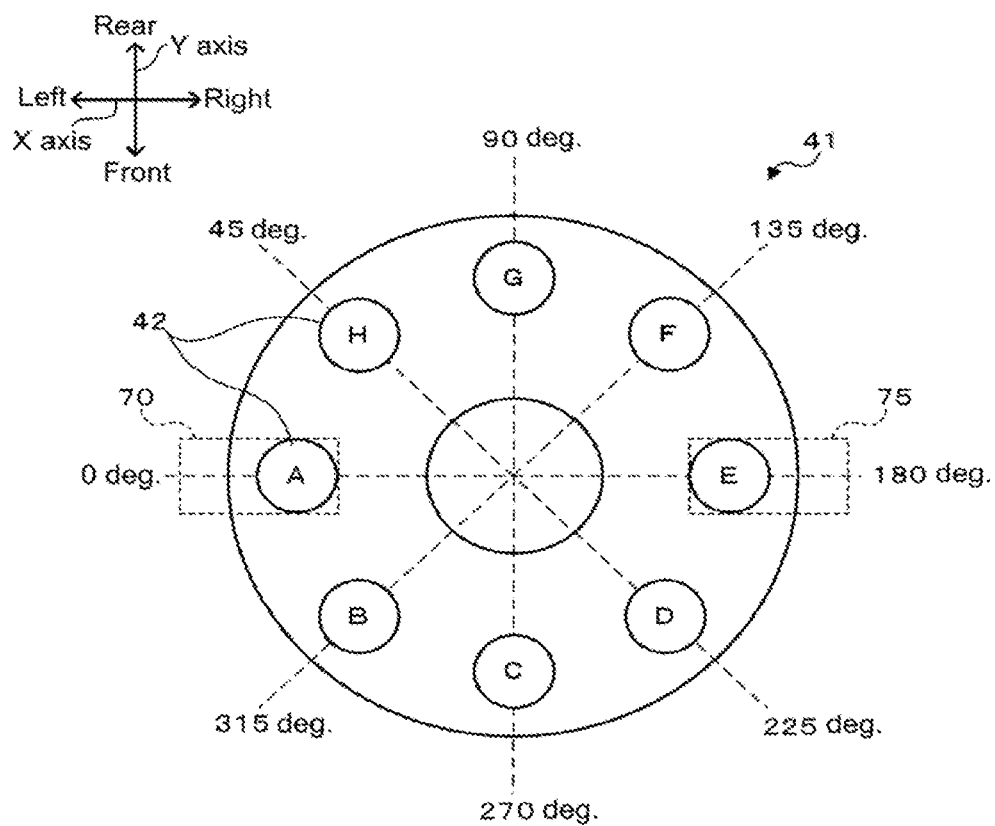
FIG. 3 illustrates the arrangement of nozzle holders 42, and the arrangement of first Z-axis driving device 70 and second Z-axis driving device 75.
Figure 4:
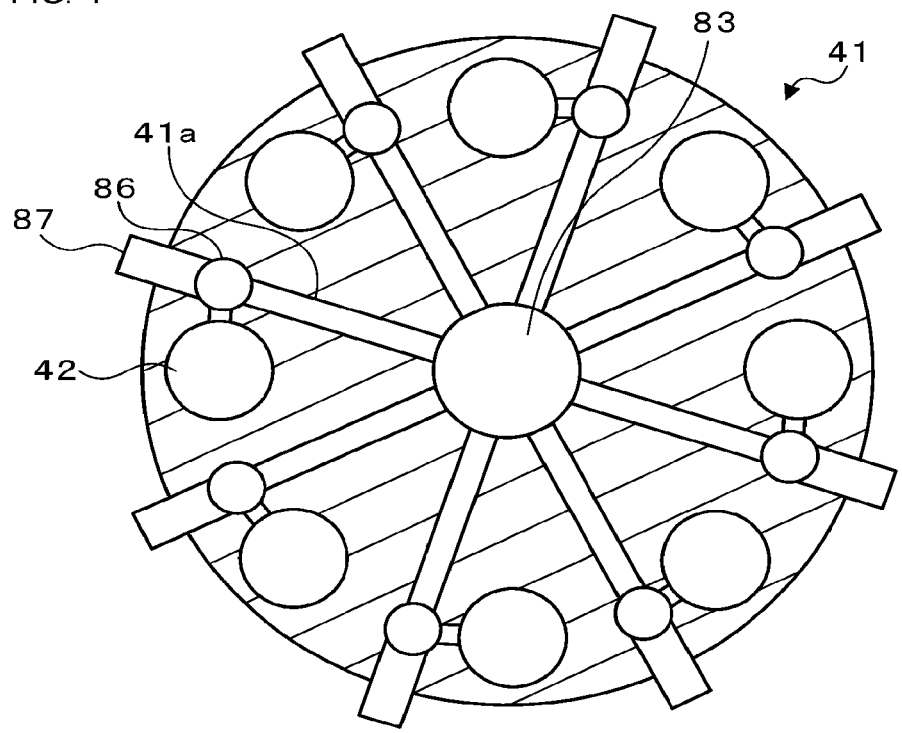
FIG. 4 illustrates air pipe paths.
Figure 5:
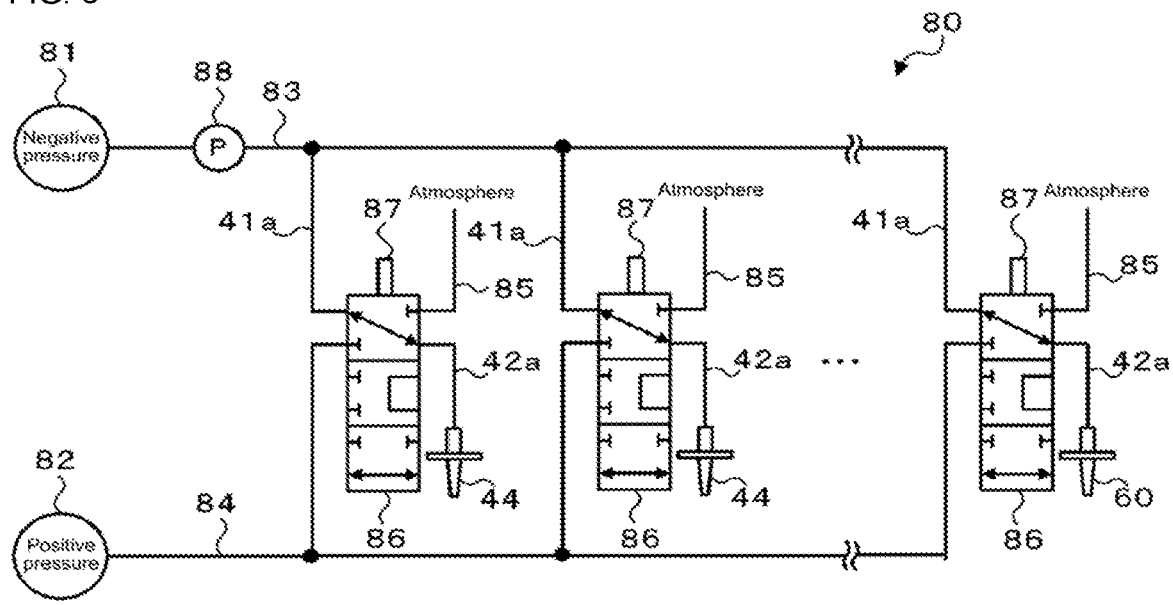
FIG. 5 is a configuration diagram showing an outline of the configuration of pressure supply device 80.
Figure 6:
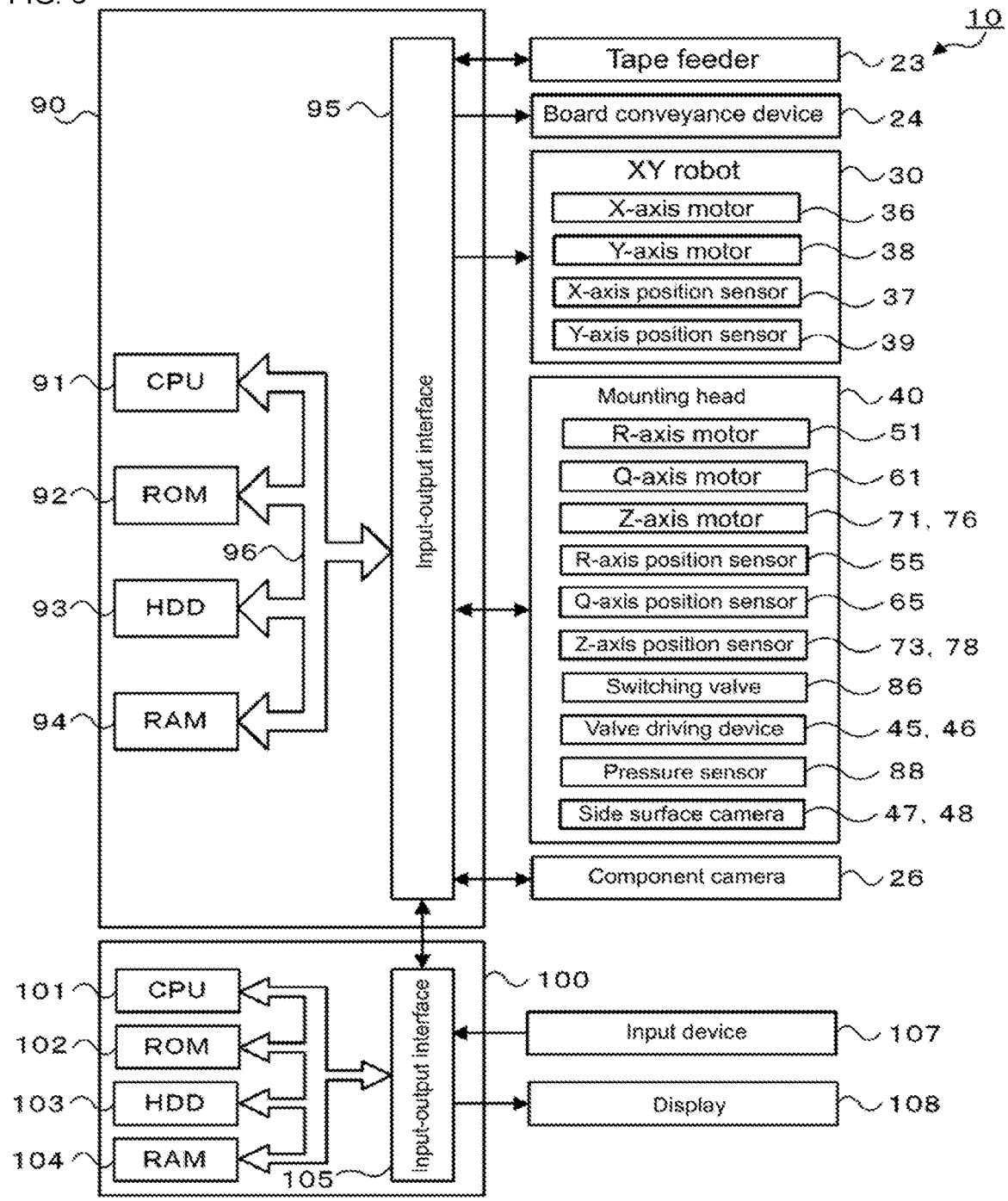
FIG. 6 illustrates electrical connections of control device 90 and management device 100.

FIG. 1 shows the overall configuration of component mounting system 10. FIG. 2 is a configuration diagram showing an outline of the configuration of mounting head 40. FIG. 3 illustrates the arrangement of nozzle holders 42, and the arrangement of first Z-axis driving device 70 and second Z-axis driving device 75. FIG. 4 illustrates air pipe paths. FIG. 5 is a configuration diagram showing an outline of the configuration of pressure supply device 80. FIG. 6 illustrates electrical connections of control device 90 and management device 100. Note that the left-right direction in FIG. 1 is the X-axis direction, the front-(near)-rear(far) direction is the Y-axis direction, and the vertical direction is the Z-axis direction perpendicular to the X-axis direction and the Y-axis direction (horizontal plane).

As shown in FIG. 1, component mounting system 1 is provided with component mounting machine 10 and management device 100 that manages component mounter 10. In the embodiment, component mounting system 1 includes multiple component mounting machines 10.

As shown in FIG. 1, component mounting machine 10 includes housing 12, component supply section 22, board conveyance device 24, XY robot 30, mounting head 40, and control device 90 (see FIG. 6). Also, component mounting machine 10 includes component camera 26, nozzle station 28, a mark camera (not shown), and the like. Component camera 26 is provided between component supply section 22 and board conveyance device 24, and is for capturing an image from below of the orientation of component P held by suction nozzle 44 of mounting head 40. Nozzle station 28 is provided between component supply section 22 and board conveyance device 24 and is for stocking suction nozzles 44 to be attached to nozzle holders 42 of mounting head 40. Mark camera is provided on mounting head 40, and is for capturing an image from above and reading positioning reference marks provided on board S.

As shown in FIG. 1, component supply section 22 is provided at the front of component mounting machine 10, and multiple tape feeders 23 are arranged along the X-axis direction (left-right direction). Note that, tape feeder 23 is provided with a reel that accommodates tape T in which components P are arranged, and supplies the components P to a component supply position by pulling out the tape T from the reel and feeding it to the rear (Y-axis direction). Tape T has multiple recesses formed longitudinally at pre-determined intervals. Each of the multiple recesses accommodates a component P of the same type. Component P accommodated in a recess is protected by a film covering the top surface of tape T, with the film being peeled off and in front of the component supply position to expose the component, after which the component is picked up by suction nozzle 44 at the component supply position.

Board conveyance device 24 includes a pair of conveyor belts provided extending in the X-axis direction (left-right direction) and separated in the front-rear direction of FIG. 1. Board S is conveyed from left to right in the drawing by the conveyor belts of board conveyance device 24.

XY robot 30 is for moving mounting head 40 in the XY-axis directions (front-rear and left-right directions), and includes X-axis slider 32 and Y-axis slider 34, as shown in FIG. 1. X-axis slider 32 is supported by a pair of upper and lower X-axis guide rails 31 provided on the front surface of Y-axis slider 34 so as to extend in the X-axis direction (left-right direction), and is movable in the X-axis direction by driving of X-axis motor 36 (refer to FIG. 6). Y-axis slider 34 is supported by a pair of left and right Y-axis guide rails 33 provided on an upper section of housing 12 so as to extend in the Y-axis direction (front-rear direction), and is movable in the Y-axis direction by driving of Y-axis motor 38 (refer to FIG. 6). Note that, the position of the X-axis slider 32 in the X-axis direction is detected by X-axis position sensor 37 (refer to FIG. 6), and the position of Y-axis slider 34 in the Y-axis direction is detected by Y-axis position sensor 39 (refer to FIG. 6). Mounting head 40 is attached to X-axis slider 32. Therefore, mounting head 40 can be moved to any position on the XY plane (horizontal plane) by performing drive control of XY robot 30 (X-axis motor 36 and Y-axis motor 38).

As shown in FIG. 2, mounting head 40 includes head main body 41, multiple (eight in the present embodiment) nozzle holders 42, multiple (eight in the present embodiment) suction nozzles 44, R-axis driving device 50, Q-axis driving device 60, first Z-axis driving device 70, second Z-axis driving device 75, side surface cameras 47 and 48.

Mounting head 40 is configured to be detachable from X-axis slider 32. That is, for example, multiple types of heads with different quantities of nozzle holders 42 (suction nozzles 44) can be attached to and detached from X-axis slider 32.

Head main body 41 is a rotation body rotatable by R-axis driving device 50. Nozzle holders 42 are arranged circumferentially with respect to head main body 41 at predetermined angular intervals (45 degrees in the present embodiment) and are supported by head main body 41 so as to be raised and lowered independently. Suction nozzle 44 is attached to the distal end section of nozzle holder 42. Suction nozzle 44 is attachable to and detachable from nozzle holder 42, and suction nozzles are exchanged as appropriate depending on the type of component P to be picked up.

R-axis driving device 50 rotates (revolves) the multiple nozzle holders 42 (multiple suction nozzles 44) in a circumferential direction around the center axis of head main body 41. As shown in FIG. 2, R-axis driving device 50 includes R-axis motor 51, R axis 52 extending axially from the center axis of head main body 41, and transmission gear 53 for transmitting the rotation of R-axis motor 51 to R-axis 52. R-axis driving device 50 rotates head main body 41 by rotationally driving R axis 52 via transmission gear 53 by R-axis motor 51. Each nozzle holder 42 rotates (revolves) circumferentially together with a suction nozzle 44 by the rotation of head main body 41. R-axis driving device 50 further includes R-axis position sensor 55 (refer to FIG. 6) for detecting the rotational position of R axis 52, that is, the revolution position of nozzle holders 42 (suction nozzles 44).

Q-axis driving device 60 rotates (spins) each nozzle holder 42 (each suction nozzle 44) about its center shaft. As shown in FIG. 2, Q-axis driving device 60 includes Q-axis motor 61, cylindrical gear 62, transmission gear 63, and Q-axis gear 64. Cylindrical gear 62 has R axis 52 coaxially inserted therethrough to be relatively rotatably, and has external teeth 62a formed on its outer peripheral surface. Transmission gear 63 is for transmitting the rotation of Q-axis motor 61 to cylindrical gear 62. Q-axis gear 64 is provided above nozzle holders 42 and slidably engages with external teeth 62a of cylindrical gear 62 in the Z-axis direction (vertical direction). Q-axis driving device 60 can rotate each Q-axis gear 64 engaging with external teeth 62a of cylindrical gear 62 collectively in the same direction by rotationally driving cylindrical gear 62 via transmission gear 63 by Q-axis motor 61. Each nozzle holder 42 rotates about its center axis integrally with suction nozzle 44 by the rotation of Q-axis gear 64. Q-axis driving device 60 further includes Q-axis position sensor 65 (refer to FIG. 6) for detecting the rotational position of Q-axis gear 64, that is, the rotational position of nozzle holders 42 (suction nozzles 44).

First and second Z-axis driving devices 70 and 75 are configured to be able to raise and lower nozzle holders 42 individually at two locations on the revolution (rotation) path of the nozzle holders 42. In the present embodiment, as shown in FIG. 3, first Z-axis driving device 70 is capable of raising and lowering nozzle holder 42 at a position of 0 degrees (hereinafter, also referred to as Z1) among the nozzle holders 42 supported on head main body 41. Further, second Z-axis driving device 70 is capable of raising and lowering nozzle holder 42 at a position of 180 degrees (hereinafter, also referred to as Z2) among the nozzle holders 42 supported on head main body 41. Note that, the 0 degree position is a position on an upstream side in the board conveyance direction among two points on a line parallel to the X-axis direction (board conveyance direction) passing through the center axis of head main body 41 (A in FIG. 3), and the 180 degree position is on a downstream side on the board conveyance direction of the above two points.

As shown in FIG. 2, first and second Z-axis driving devices 70 and 75 are respectively provided with Z-axis sliders 72 and 77 and the corresponding Z-axis motors 71 and 76 for raising and lowering Z-axis sliders 72 and 77. First and second Z-axis driving devices 70 and 75, by driving Z-axis motors 71 and 76 to raise and lower the corresponding Z-axis sliders 72 and 77, contact the nozzle holder 42 below Z-axis sliders 72 and 77 such that the nozzle holder 42 is raised or lowered integrally with suction nozzle 44. Note that, first and second Z-axis driving devices 70 and 75 may use a linear motor as Z-axis motors 71 and 76 to raise and lower Z-axis sliders 72 and 77, or may use a rotating motor and screw feeding mechanism to raise and lower Z-axis sliders 72 and 77. Further, first and second Z-axis driving devices 70 and 75, instead of Z-axis motors 71 and 76, may use an actuator such as an air cylinder to raise and lower Z-axis sliders 72 and 77. In this manner, mounting head of the present embodiment is provided with two Z-axis driving devices, 70 and 75, capable of individually raising and lowering nozzle holders 42 (suction nozzles 44) such that pickup operation of component P by suction nozzle 44 can be performed individually using Z-axis driving devices 70 and 75. Thus, mounting head 40 is able to lower two suction nozzles 44 simultaneously to pick up two components P simultaneously by supplying two components P from tape feeders 23 lined up in the X-axis direction (left-right direction) with the same interval as two suction nozzles 44 that can be raised and lowered by the two Z-axis driving devices 70 and 75. Further, first and second Z-axis driving devices 70 and 75 are also provided with Z-axis position sensors 73 and 78 (refer to FIG. 6) for detecting the raising and lowering position of the corresponding Z-axis slider 72 and 77, that is, the raising and lowering position of the corresponding nozzle holder 42 (suction nozzle 44).

Suction nozzle 44 is capable of picking up component P and mounting component P on board S by being supplied with pressure (negative pressure, positive pressure) supplied by pressure supply device 80. As shown in FIG. 5, pressure supply device 80 includes negative pressure source (negative pressure pump) 81, positive pressure source (factory air) 82, and switching valve 86 capable of switching the pressure supplied to the pickup openings of suction nozzles 44 to any of negative pressure, positive pressure, and atmospheric pressure. Switching valve 86 is a four-opening three-position valve connected in which are negative pressure flow path 83 connected to negative pressure source 81, positive pressure flow path 84 connected to positive pressure source 82, atmospheric pressure flow path 85 connected to the atmosphere, and holder flow path 42a formed inside nozzle holder 42 connected to the suction opening of suction nozzle 44. Switching valve 86 can supply negative pressure to the suction opening of suction nozzle 44 by switching the valve position to a position (negative pressure supply position) where holder flow path 42a is connected to negative pressure flow path 83 and is shut off from the other flow paths. Also, switching valve 86 can supply atmospheric pressure to the suction opening of suction nozzle 44 by switching the valve position to a position (atmospheric pressure supply position) where holder flow path 42a is connected to atmospheric pressure flow path 85 and is shut off from the other flow paths. Further, switching valve 86 can supply positive pressure to the suction opening of suction nozzle 44 by switching the valve position to a position (positive pressure supply position) where holder flow path 42a is connected to positive pressure flow path 84 and is shut off from the other flow paths. As shown in FIG. 4, switching valve 86 is provided corresponding to each nozzle holder 42 (holder flow path 42a), is connected to the negative pressure flow path 83 via radial flow path 41a extending radially from the axial center of head main body 41, and is connected to positive pressure flow path 84 via a radial flow path (not shown) extending in the same manner. Pressure sensor 88 for detecting the pressure (negative pressure) inside negative pressure flow path 83 is provided in negative pressure flow path 83.

Further, switching valve 86 does not have an automatic return function, and the valve position is switched to the negative pressure supply position, the atmospheric pressure supply position, and the positive pressure supply position by the operation of valve operating lever 87. Valve operating lever 87 is operated by either of first and second valve driving devices 45 and 46, as shown in FIG. 2. First valve driving device 45 can drive valve operating lever 87 of switching valve 86 corresponding to the nozzle holder 42 in the position (Z1) at which movement up and down by first Z-axis driving device 70 is possible. Second valve driving device 46 can drive valve operating lever 87 of switching valve 86 corresponding to the nozzle holder 42 in the position (Z2) at which movement up and down by second Z-axis driving device 75 is possible. Note that, first and second valve driving device 45 and 46 can be configured by using, for example, a motor and a converting mechanism (such as a cam mechanism or a linkage mechanism) for converting the rotational movement of the motor into stroke movement.

Side surface cameras 47 and 48 image the vicinity of the distal end portion of suction nozzle 44 from the side in order to determine whether a component is being held by the suction nozzle 44 and the pickup orientation of the component after the pickup operation has been performed by the suction nozzle 44. In the present embodiment, after a suction nozzle 44 has been lowered by first Z-axis driving device 70 and pickup operation has been performed, side surface camera 47 can take an image of the suction nozzle 44 revolved previously by R-axis driving device 50. Further, after a suction nozzle 44 has been lowered by second Z-axis driving device 70 and pickup operation has been performed, side surface camera 48 can take an image of the suction nozzle 44 revolved previously by R-axis driving device 50.

As shown in FIG. 6, control device 90 is configured from CPU 91 that is based around a microprocessor, and is also provided with items such as ROM 92, HDD 93, RAM 94, and input-output interface 95. These items are connected by bus 96. Various detection signals from X-axis position sensor 37, Y-axis position sensor 39, R-axis position sensor 55, Q-axis position sensor 65, Z-axis position sensors 73 and 78, pressure sensor 88, and the like are inputted to control device 90. Also, image signals from component camera 26, the mark camera, and side surface cameras 47 and 48 are also inputted to control device 90 via input-output interface 95. On the other hand, control device 90 outputs various control signals to tape feeder 23, board conveyance device 24, X-axis motor 36, Y-axis motor 38, R-axis motor 51, Q-axis motor 61, Z-axis motor 71 and 76, first and second valve driving devices 45 and 46, component camera 26, the mark camera, side surface cameras 47 and 48, and the like.

Management device 100, for example, is a general purpose computer configured from, as shown in FIG. 6, items such as CPU 101, ROM 102, HDD 103, RAM 104, and input-output interface 105. Management computer 100 receives input signals from input device 107 such as a mouse or keyboard via input-output interface 105. Management device 100 outputs image signals to display 108 via input-output interface 105. HDD 103 stores job information including a production program of the board S and other production information. Here, a production program refers to a program that determines which components P are mounted on which board S in which order in component mounting machine 10, and how many pieces of the board S so mounted are produced. Further, the production information includes component information (type and component supply position of component P) relating to components P to be mounted on board S, nozzle information (nozzle diameter Rn) relating to suction nozzle 44 to be used, target mounting position (XY coordinate) of component P, and the like. Management device 100 is communicably connected to control device 90 of component mounting machine 10, and communication is performed of various kinds of data and control signals.

Component mounting machine 10 according to the embodiment configured as described above performs pickup operation, imaging operation, and mounting operation as one cycle when the job information is received by management device 100. Pickup operation is an operation in which mounting head 40 is moved above the component supply position, a corresponding nozzle holder 42 is lowered while each nozzle holder 42 (suction nozzle 44) is revolved such that component P contacts the suction opening of the suction nozzle 44 in the component supply position, and negative pressure is supplied to the suction opening of the corresponding suction nozzle 44. Imaging operation is an operation of using component camera 26 to capture an image of the component P held by the suction nozzle 44 in the pickup operation, and detecting a pickup deviation by processing the obtained captured image to correct the target mounting position of the component P. Mounting operation is an operation in which the mounting head 40 is moved above a target mounting position on board S, the corresponding nozzle holder 42 is lowered while the nozzle holders 42 (the suction nozzle 44) are revolved such that the component P held by the suction nozzle 44 contacts the target mounting position, and positive pressure is supplied to the suction opening of the corresponding suction nozzle 44.

Figure 7:
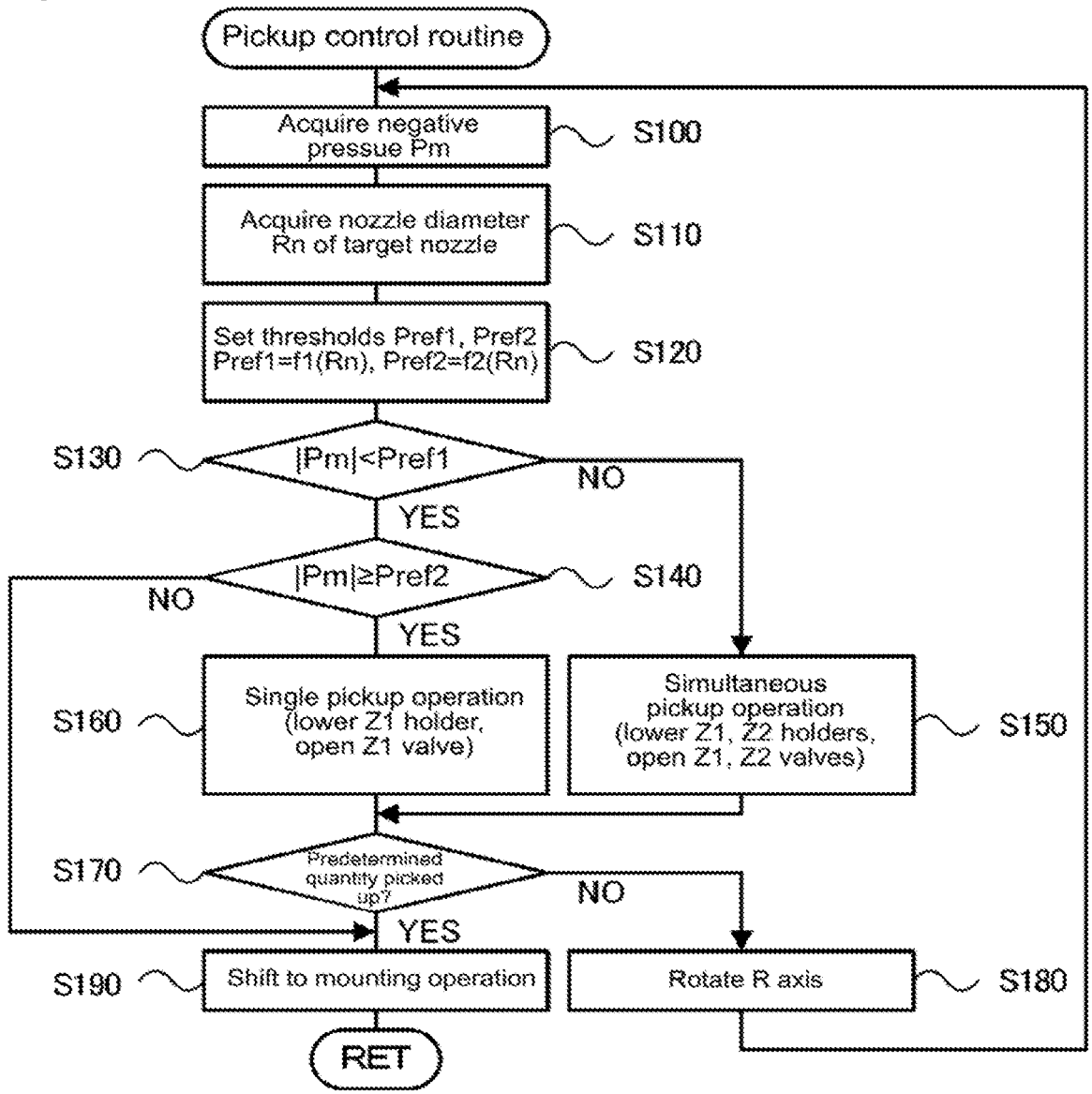
FIG. 7 is a flowchart showing an example of a pickup control routine.

FIG. 7 is a flowchart showing an example of a pickup control routine performed by CPU 91 of control device 90. When the pickup control routine is performed, CPU 91 of control device 90 first acquires the pressure (negative pressure Pm) inside negative pressure flow path 83 (S100), and acquires nozzle diameter Rn of the pickup target nozzle (S110). Note that, negative pressure Pm can be obtained from the detection signals of pressure sensor 88. Also, nozzle diameter Rn can be acquired from the nozzle information included in the job information received from management device 100. Subsequently, CPU 91 sets thresholds Pref1, Pref2 based on the nozzle diameter Rn (S120), and determines whether the absolute value of negative pressure Pm is less than threshold value Pref1 (S130), and whether the absolute value of negative pressure Pm is equal to or greater than threshold value Pref2 (S140), respectively. If CPU 91 determines that the absolute value of negative pressure Pm is not less than threshold value Pref1, that is, the absolute value Pm is equal to or greater than threshold value Pref1, it performs simultaneous pickup operation (S150). Simultaneous pickup operation is performed by sequentially controlling tape feeder 23, XY robot 30, R-axis driving device 50, first and second Z-axis driving devices 70 and 75, and first and second valve driving devices 45 and 46 such that the respective pickup target components are simultaneously picked up by the two pickup target nozzles. Specifically, CPU 91 transmits control signals to the corresponding tape feeders 23 such that the two suction target components are supplied to the respective component supply positions, and controls XY robot 30 such that mounting head 40 moves above the two pickup target components. Next, CPU 91 controls R-axis driving device 50 and the first and second Z-axis driving devices 70 and 75 such that the corresponding two nozzle holders 42 are lowered while being revolved such that the two pickup target nozzles of mounting head 40 arrive at Z1 and Z2 until the respective pickup target components are contacted (Z1 holder and Z2 holder lowering). Then, CPU 91 controls the first and second valve driving devices 45 and 46 such that negative pressure is supplied to the suction openings of the two target suction nozzles, respectively (that is, Z1 valve and Z2 valve are opened). If CPU 91 determines that the absolute value of negative pressure Pm is less than threshold value Pref1 and at least equal to threshold value Pref2, it performs single pickup operation (S160). Single pickup operation is performed by sequentially controlling tape feeder 23, XY robot 30, R-axis driving device 50, first and second Z-axis driving devices 70 and 75, and first and second valve driving devices 45 and 46 such that one pickup target component is picked up by one pickup target nozzle. Specifically, CPU 91 transmits control signals to the single tape feeder 23 such that the target component is supplied to the respective component supply position, and controls XY robot 30 such that mounting head 40 moves above the pickup target component. Next, CPU 91 controls R-axis driving device 50 and first Z-axis driving devices 70 such that the corresponding nozzle holder 42 is lowered while being revolved such that the pickup target nozzle of mounting head 40 arrives at Z1 until the respective pickup target component is contacted (Z1 holder lowering). Then, CPU 91 controls the first valve driving device 45 such that negative pressure is supplied to the suction opening of the target suction nozzle (that is, Z1 valve is opened). Note that, in the present embodiment, first valve driving device 45 is controlled such that nozzle holder 42 is lowered at Z1 by first Z-axis driving device 70 and negative pressure is supplied to the corresponding suction nozzle 44, but second valve driving device 46 may be controlled such that nozzle holder 42 is lowered at Z2 by second Z-axis driving device 75 and negative pressure is supplied to the corresponding suction nozzle 44.

Here, as described above, holder flow paths 42a of the respective nozzle holders 42 are connected to shared negative pressure flow path 83 (negative pressure source 81) via a corresponding switching valve 86. Pickup operation is performed by driving the corresponding switching valve 86 such that negative pressure is supplied to the suction opening of the pickup target nozzle such that holder flow path 42a of the corresponding nozzle holder 42 and shared negative pressure flow path 83 are connected to each other. Here, if the component P is not picked up by the pickup target nozzle for some reason (a pickup error occurs), negative pressure leaks from the open suction opening, and the absolute value of negative pressure Pm in negative pressure flow path 83 decreases. In this case, the absolute value of negative pressure Pm supplied from shared negative pressure flow path 83 to the suction openings of other suction nozzles 44 also decreases, and when the absolute value of negative pressure Pm becomes less than the lower limit value, the other suction nozzles 44 cannot hold component P. Threshold value Pref1 is determined such that the absolute value of negative pressure Pm is not less than the above-mentioned lower limit value even if a pickup error occurs with any of the two pickup target nozzles after the simultaneous pickup operation. On the other hand, threshold value Pref2 is determined such that even if a pickup error occurs in the single pickup target nozzle after the single pickup operation, the absolute value of negative pressure Pm is not less than the above-mentioned lower limit value. For example, when the absolute value of negative pressure Pm of negative pressure flow path 83 for which the suction nozzle 44 cannot hold component P is 10 kPa and the absolute value of negative pressure Pm of negative pressure flow path 83 decreases by 1 kPa when a single pickup error occurs, because there are two pickup target nozzles to perform simultaneous pickup operation, threshold value Pref1 is 12 kPa and threshold value Pref2 is 11 kPa. For example, when the absolute value of negative pressure Pm in negative pressure flow path 83 is 11.5 kPa, if simultaneous pickup operation is performed, the absolute value of negative pressure Pm becomes 9.5 kPa when a pickup error occurs in either of the two pickup target nozzles, therefore, the other suction nozzle 44 cannot hold component P. On the other hand, in the case of single pickup operation, even if a pickup error occurs in the single pickup target nozzle, the absolute value of negative pressure Pm becomes 10.5 kPa, such that the other suction nozzle 44 can hold component P. Further, when the absolute value of negative pressure Pm in negative pressure flow path 83 is 10.5 kPa, subsequently, if a pickup error occurs, the absolute value of negative pressure Pm becomes less than 10 kPa, therefore the other suction nozzle 44 cannot hold component P. In this manner, component mounter 10 selects whether to perform simultaneous pickup operation, perform single pickup operation, or not perform any pickup operation, such that the absolute value of negative pressure Pm does not become less than the lower limit value even if a pickup error occurs, in accordance with the current negative pressure Pm of negative pressure flow path 83. As a result, component mounting machine 10 can pick up as many components as possible using multiple suction nozzles 44 while suppressing the dropping of the components held by the other suction nozzles 44 even when a pickup error occurs. When a pickup error occurs, the negative pressure drop in negative pressure flow path 83 (negative pressure leak amount) increases as nozzle diameter Rn of the pickup target nozzle increases. Therefore, threshold values Pref1 and Pref2 are determined so as to increase as the nozzle diameter Rn increases. In the present embodiment, threshold value Pref1 can be set by obtaining the relationship between nozzle diameter Rn and threshold value Pref1 in advance and storing it in ROM 92 as a map, and extracting the corresponding threshold value Pref1 from the map when the nozzle diameter Rn is given. The setting of threshold value Pref2 can be performed in a similar manner.

Then, CPU 91 determines whether a predetermined quantity of components P have been picked up by multiple suction nozzles 44 (S170). If CPU 91 determines that the predetermined quantity of components P has not been picked up, it controls the driving of R-axis driving device 50 such that the next target pickup nozzle arrives at Z1 or Z2 (a position where it can be raised and lowered by the first Z-axis driving device 70 or second Z-axis driving device 75) (S180), then returns to S100 to repeat processing of S100 to S170. If the CPU 91 determines that the predetermined quantity of components P has been picked up, it shifts to the mounting operation via the imaging operation (S190) in order to mount the components P on the board S, then ends the pickup control routine.

If CPU 91 determines that the absolute value of negative pressure Pm is not equal to or greater than threshold value Pref2 in S140, that is, is less than the threshold value Pref2, it proceeds directly to the mounting operation via the imaging operation (S190), and ends the pickup control routine. If the absolute value of negative pressure P is less than threshold value Pref2, CPU 91 determines that a component P held by other suction nozzles 44 cannot be held if just one pickup error occurs thereafter, and shifts to the mounting operation (imaging operation) in order to mount the component P held by other suction nozzles 44 even if the predetermined quantity of components P has not yet been picked up. In a case in which CPU 91 can perform single pickup operation when simultaneous pickup operation cannot be performed, single pickup operation is repeatedly performed until a pickup error occurs in single pickup operation and the absolute value of negative pressure Pm becomes less than threshold value Pref or a predetermined quantity of components P have been picked up.

Here, correspondence relationships between constituent elements of an embodiment and constituent elements of the present disclosure described in the claims will be clarified. Component supply section 22 of the embodiment corresponds to a component supply section of the present disclosure, tape feeder 23 corresponds to a component feeder, component mounting machine 10 corresponds to a component mounting machine, suction nozzle 44 corresponds to a nozzle, mounting head 40 corresponds to a head, negative pressure source 81 corresponds to a negative pressure source, pressure supply device 80 corresponds to a negative pressure supply device, first and second Z-axis driving devices 70 and 75 correspond to a raising and lowering device, and control device 90 corresponds to a control device. Further, mounting head 40 corresponds to a rotary head, first Z-axis driving device 70 corresponds to a first raising and lowering device, and second Z-axis driving device 75 corresponds to a second raising and lower device.

Component mounting machine 10 of an embodiment described above includes control device 90 configured to perform, as a pickup operation, a first pickup operation of controlling the raising and lowering device to lower one of the pickup target nozzles and controlling the negative pressure supply device to supply negative pressure to the suction opening of that pickup target nozzle so as to pick up the component using the suction opening of that pickup target nozzle, and a second pickup operation of controlling the raising and lowering device to lower multiple of the pickup target nozzles simultaneously and controlling the negative pressure supply device to supply negative pressure to the suction openings of those multiple pickup target nozzles so as to pick up the components simultaneously using the suction openings of those multiple pickup target nozzles. Control device performs the second pickup operation in a case in which an absolute value of negative pressure Pm from negative pressure source 81 is equal to or greater than threshold value Pref1, performs the first pickup operation in a case in which the absolute value of negative pressure Pm is less than the threshold value Pref1 and equal to or greater than threshold value Pref2 that is lower than threshold value Pref1, and does not perform any pickup operation in a case in which the absolute value of negative pressure Pm is less than threshold value Pref2. Thus, component mounting machine 10 can pick up as many components P as possible using multiple suction nozzles while suppressing the dropping of the components held by the other suction nozzles even when a pickup error occurs. As a result, with component mounting machine 10, the number of components P to be picked up and mounted per cycle is increased, such that mounting efficiency is improved.

Further, component mounting machine 10 of an embodiment determines whether simultaneous pickup operation or single pickup operation is possible by setting threshold values Pref1 and Pref2 such that the larger the nozzle diameter Rn of the pickup target nozzle is, the larger the threshold is. The larger the nozzle diameter Rn of suction nozzle 44, the larger the leakage amount of the negative pressure when a pickup error occurs, therefore, thresholds Pref1 and Pref2 are optimized by being larger the larger the nozzle diameter Rn is.

Meanwhile, it goes without saying that the disclosure is not limited to the above-mentioned embodiment and various embodiments may be applied within the technical scope of the disclosure.

For example, in an embodiment described above, the component mounting machine 10 includes rotary-type mounting head 40 in which multiple nozzle holders 42 are circumferentially arranged with respect to head main body 41. However, component mounting machine 10 may include an inline-type mounting head having nozzle holders (suction nozzles) arranged at the same pitch as the component feeders (tape feeders 23) along the arrangement direction of the component feeders and capable of being raised and lowered independently.

In an embodiment described above, mounting head 40 includes two Z-axis driving devices, 70 and 75, for individually raising and lowering two nozzle holders 42 (suction nozzles 44) at a specified position. However, mounting head 40 may have N quantity of Z-axis driving devices (where N is a natural number of 3 or more) and N quantity of suction nozzles may be simultaneously lowered by the N quantity of Z-axis driving devices such that N quantity of components P are simultaneously picked up by respective suction nozzles. In this case, as threshold value Pref1 for determining whether simultaneous pickup operation is possible, threshold P(N) that allows simultaneous pickup operation of N components P, threshold P(N−1) that allows simultaneous pickup operation of (N−1) components P, . . . , and so on down to a threshold of N of threshold P1 that allows single pickup operation of the one component P are provided. CPU 91 performs simultaneous pickup operation of the N components P when the absolute value of the pressure (negative pressure Pm) inside negative pressure flow path 83 is equal to or greater than the threshold P(N), does not perform pickup operation when the absolute value of the negative pressure Pm is less than threshold P1, and performs pickup operation by determining the number of components that can be picked up simultaneously from among the N thresholds P1, P(N−1), P(N) when the absolute value of negative pressure Pm is equal to or greater than threshold P1 and less than threshold P(N). Note that, when pickup operation of a quantity of components P smaller than N is performed, CPU 91 performs pickup operation of the remaining components Pin accordance with the negative pressure Pm after the pickup operation until the absolute value of negative pressure Pm becomes less than threshold value P1 due to a pickup error or the predetermined number of components P have been picked up.

In an embodiment described above, threshold value Pref1 for determining the possibility of simultaneous pickup operation and threshold value Pref2 for determining the possibility of single pickup operation are set so as to increase as the nozzle diameter Rn of the pickup target nozzle increases. However, factors other than nozzle diameter Rn may be considered in setting threshold values Pref1 and Pref2, such as having a nozzle with multiple suction openings or a suction opening with a custom shape. Further, a fixed value may be set for threshold values Pref1 and Pref2. In this case, threshold values Pref1 and Pref2 may be set so as to correspond to the largest nozzle diameter of the multiple types of suction nozzles 44 that can be attached to nozzle holder 42.

In an embodiment described above, threshold values Pref1 and Pref2 are set according to the type of the suction nozzle. However, threshold values Pref1 and Pref2 may be set in accordance with the type of the head (for example, the number of nozzle holders that are attached) mounted on component mounting machine 10 (X-axis slider 32).

In an embodiment described above, mounting head 40 includes two Z-axis driving devices, 70 and 75, for individually raising and lowering two nozzle holders 42 (suction nozzles 44) at a specified position. However, mounting head 40 may have only one Z-axis driving device, and one suction nozzle may be lowered by the Z-axis driving device to pick up one component P using the suction nozzle. However, in this case, simultaneous pickup operation cannot be executed. In this instance, as a threshold value for determining whether pickup operation is permitted, a threshold value Pref is provided which is set so as to increase as the nozzle diameter Rn of the pickup target nozzle increases. Then, CPU 91 performs pickup operation when the absolute value of the pressure in negative pressure flow path 83 is equal to or greater than threshold value Pref, and does not perform pickup operation when the absolute value of negative pressure Pm is less than threshold value Pref. That is, an alternative component mounting machine of this disclosure may include: multiple component feeders arranged in a line on a component supply section of the component mounting machine, the component mounting being configured to pick up a component supplied from the component feeder and mount the component on a board; a head including multiple nozzles configured to pick up the component using a suction opening; a negative pressure supply device including a negative pressure source configured to generate negative pressure, the negative pressure supply device being configured to supply negative pressure from the negative pressure source to the suction openings of the multiple nozzles; a raising and lowering device configured to individually raise and lower the multiple nozzles; and a control device configured to perform a pickup operation of controlling the raising and lowering device to lower the nozzle and controlling the negative pressure supply device to supply negative pressure to the suction opening of the nozzle so as to pick up the component using the suction opening of the nozzle, wherein the control device is configured to perform the pickup operation in a case in which an absolute value of the negative pressure from the negative pressure source is equal to or greater than a threshold value, and not perform the pickup operation in a case in which the absolute value of the negative pressure from the negative pressure source is less than the threshold value, further wherein multiple types of suction nozzles with different diameters of suction openings can be attached to the head, and the threshold value is larger the larger the diameter of the nozzle attached to the head is.

In an embodiment above, XY robot 30 moves mounting head 40 in XY-axis directions, however, board B may be moved in XY-axis directions.

In an embodiment described above, component mounting machine 10 includes position sensors 37, 39, 55, 65, 73, and 78 for detecting the positions of the respective axes (X axis, Y axis, R axis, Q axis, and Z axis), but the "position sensors" may include an encoder or a linear scale.

INDUSTRIAL APPLICABILITY

The present disclosure may be applied to the industrial field of component mounters and the like.

REFERENCE SIGNS LIST

1: component mounting system;
10: component mounting machine;
12: housing;
22: component supply section;
24: board conveyance device;
26: component camera;
28: nozzle station;
30: XY robot;
31: X-axis guide rail;
32: X-axis slider;
33: Y-axis guide rail;
34: Y-axis slider;
36: X-axis motor;
37: X-axis position sensor;
38: Y-axis motor;
39: Y-axis position sensor;
40: mounting head;
41: head main body;
41*a*: radial flow path;
42: nozzle holder;
42*a*: holder flow path;
44: suction nozzle;
45: first valve driving device;
46: second valve driving device;
47, 48: side surface camera;
50: R-axis driving device;
31: R-axis motor;
52: R axis;
53: transmission gear;
55: R-axis position sensor;
60: Q-axis driving device;
61: Q-axis motor;
62: cylindrical gear;
62*a*: external tooth;
64: Q-axis gear;
65: Q-axis position sensor;
70: first Z-axis driving device;
71, 76: Z-axis motor;
72, 77: Z-axis slider;
73, 78: Z-axis position sensor;
75: second Z-axis driving device;
80: pressure supply device;
81: negative pressure source;
82: positive pressure source;
83: negative pressure flow path;
84: positive pressure flow path;
85: atmospheric pressure flow path;
86: switching valve;
87: valve operating lever;
88: pressure sensor;
90: control device;
91: CPU;
92: ROM; 93: HDD;
94: RAM;
95: input-output interface;
96: bus;
100: management device;
101: CPU;
102: ROM;
103: HDD;
104: RAM;
105: input-output interface;
107: input device;
108: display;
P: component;
S: board

The invention claimed is:

1. A component mounting machine comprising:
multiple component feeders arranged in a line on a component supply section of the component mounting machine, the component mounting machine being configured to pick up a component supplied from the component feeder and mount the component on a board;
a head including multiple nozzles configured to pick up the component using a suction opening;
a negative pressure supply device including a negative pressure source configured to generate negative pressure, the negative pressure supply device being configured to supply negative pressure from the negative pressure source individually to the suction openings of the multiple nozzles;
a raising and lowering device configured to individually raise and lower the multiple nozzles; and
a control device including a processor configured to acquire a negative pressure value of the negative pressure source, acquire a characteristic of the head including the multiple nozzles set a first threshold value and a second threshold value based on the a characteristic of the head including the multiple nozzles, the second threshold value being smaller than the first threshold value, compare an absolute value of the negative pressure value of the negative pressure source with the first threshold value, when the absolute value of the negative value of the negative pressure source is less than the first threshold value, compare the absolute value of the negative value of the negative pressure source with the second threshold value, when the absolute value of the negative value of the negative pressure source is greater than or equal to the second threshold value, perform a first pickup operation by controlling the raising and lowering device to lower one nozzle of the multiple nozzles and controlling the negative pressure supply device to supply negative pressure to the suction opening of the one nozzle of the multiple nozzles so as to pick up the component using the suction opening of the one nozzle of the multiple nozzles, when the absolute value of the negative value of the negative pressure source is greater than or equal to the first threshold value, perform a second pickup operation by controlling the raising and lowering device to lower at least two nozzles of the multiple nozzles simultaneously and controlling the negative pressure supply device to supply negative pressure to the suction openings of the at least two nozzles of the multiple nozzles so as to pick up the components simultaneously using the suction openings of the at least two nozzles of the multiple nozzles, and when the absolute value of the negative value of the negative pressure source is greater than or equal to the second threshold value, not perform any pickup operation.

2. The component mounting machine according to claim 1, wherein the head is configured to hold multiple types of nozzles, and the control device is configured to determine the first threshold value and the second threshold according to the type of the nozzle held by the head.

3. The component mounting machine according to claim 2, wherein the head is configured to hold multiple types of the nozzles with the suction openings having different diameters, and the control device is configured to determine the first threshold value and the second threshold value based on the diameter of the nozzle, the first threshold value and the second threshold value increasing as the diameter of the nozzle held by the head increases.

4. The component mounter according to claim 1, wherein multiple types of the heads are configured to be attached to the component mounting machine, and the control device is configured to determine the first threshold value and the second threshold value according to the type of the head attached to the component mounting machine.

5. The component mounting machine according to claim 1, wherein the head is a rotary head that includes a rotation body configured to support multiple nozzle holders so as to be raised and lowered, the multiple nozzle holders being configured to hold the nozzles and being arranged in a circumferential direction, the rotary head being configured to revolve the multiple nozzle holders in the circumferential direction by rotating the rotation body, and the raising and lowering device includes a first raising and lowering device configured to raise and lower, among the multiple nozzle holders, the nozzle holder positioned at a first position, and a second raising and lowering device configured to raise and lower, among the multiple nozzle holders, the nozzle holder positioned at a second position that is different from the first position.

6. The component mounting machine according to claim 5, wherein the first position is a position on an upstream side in a board conveyance direction among two points on a line parallel to the board conveyance direction passing through a center axis of rotation body, and the second position is a position on a downstream side on the board conveyance direction of the two points.

* * * * *